United States Patent
Xu et al.

(10) Patent No.: US 9,054,798 B2
(45) Date of Patent: Jun. 9, 2015

(54) NON-FOSTER CIRCUIT STABILIZATION METHOD

(75) Inventors: Zhiwei Xu, Los Angeles, CA (US); Michael W. Yung, Los Angeles, CA (US); Donald A. Hitko, Grover Beach, CA (US); Carson R. White, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 288 days.

(21) Appl. No.: 13/542,654

(22) Filed: Jul. 5, 2012

(65) Prior Publication Data
US 2013/0009724 A1 Jan. 10, 2013

Related U.S. Application Data (60) Provisional application No. 61/505,028, filed on Jul. 6, 2011.

(51) Int. Cl.
*H03H 7/38* (2006.01)
*H04B 1/10* (2006.01)
*H04B 1/04* (2006.01)

(52) U.S. Cl.
CPC ............ *H04B 17/104* (2015.01); *H04B 1/0458* (2013.01); *H04B 17/345* (2015.01)

(58) Field of Classification Search
USPC .......................................................... 333/32
See application file for complete search history.

(56) References Cited

U.S. PATENT DOCUMENTS

| | | | |
|---|---|---|---|
| 5,479,129 A * | 12/1995 | Fernandez et al. | 327/276 |
| 7,245,893 B1 | 7/2007 | Husted et al. | |
| 7,859,474 B1 | 12/2010 | Cripe | |
| 2002/0044100 A1 * | 4/2002 | Jagielski et al. | 343/850 |
| 2006/0145762 A1 | 7/2006 | Leete | |
| 2009/0298422 A1 | 12/2009 | Conroy et al. | |
| 2010/0144295 A1 | 6/2010 | Kroeger | |
| 2011/0149773 A1 | 6/2011 | Lee et al. | |
| 2011/0165853 A1 * | 7/2011 | Robert et al. | 455/269 |

FOREIGN PATENT DOCUMENTS

| | | |
|---|---|---|
| CN | 102005648 A | 4/2011 |
| EP | 1137192 | 9/2001 |
| JP | 2290745 | 3/2011 |
| WO | 2010-068417 | 6/2010 |

OTHER PUBLICATIONS

ISR and WO for PCT/US2012/045620 mailed on Jan. 10, 2013.
R.R. Hoskins, "Stability of negative impedance converters," Electronics Letters, vol. 2, No. 9, Sep. 1966.
(Continued)

*Primary Examiner* — Stephen E Jones
*Assistant Examiner* — Scott S Outten
(74) *Attorney, Agent, or Firm* — Ladas & Parry (57) ABSTRACT

A method of and circuit for improving stabilization of a non-Foster circuit. The method comprises steps of and the circuit includes means for measuring a noise hump power at an antenna port or an output port of the non-Foster circuit, comparing the measured noise hump power with a desired level of noise power that corresponds to a desired operating state of the non-Foster circuit, and tuning the non-Foster circuit to generate the desired level of noise power to achieve the desired operating state of the non-Foster circuit.

15 Claims, 6 Drawing Sheets

(56) References Cited

OTHER PUBLICATIONS

J.G. Linvill, "Transistor Negative Impedance Converters," Proc. IRE, vol. 41, Jun. 1953, pp. 725-729.

Stephen E. Sussman-Fort and Ronald M. Rudish, "Non-Foster Impedance Matching of Electrically Small Antennas", IEEE Transactions on Antennas and Propagation, vol. 57, No. 8, Aug. 2009, pp. 2230-2241.

PCT International Preliminary Report on Patentability from PCT/US2012/045620 dated Jan. 7, 2014.

Office action from Chinese Patent Application No. 2012800334406 dated Sep. 26, 2014 with search report, and its English summary.

Li Wen-xing, et al., "Stability analysis of active antenna design based on negative impedance convertor," Applied Science and Technology, vol. 37, No. 4, and its machine English translation.

Office action from corresponding Chinese Patent Application No. 2012800334406 dated Feb. 15, 2015 and its English summary.

EPO Extended Search Report with Opinion dated Feb. 18, 2015 from corresponding EPO Application No. 12807932.4.

\* cited by examiner

NON-FOSTER CIRCUIT STABILIZATION METHOD

CROSS REFERENCE TO RELATED APPLICATIONS

This application claims the benefit of U.S. Provisional Patent Application Ser. No. 61/505,028 filed Jul. 6, 2011 and entitled "Non-foster Circuit Stabilization Method", the disclosure of which is hereby incorporated herein by reference.

TECHNICAL FIELD

This disclosure relates to methods which may be used to increase the stability of non-Foster circuits and hence also the stability of circuits which utilize non-Foster circuits.

BACKGROUND

Non-Foster antenna matching networks utilize non-Foster circuits (NFCs) which can, in theory, overcome limitations of traditional passive circuits by using active non-Foster circuits to synthesize negative capacitors and negative inductors. Electrically small antennas tend to have capacitive reactance and using a negative capacitive reactance in an Electrically Small Antenna (ESA) matching network can be used to offset largely the capacitance of the antenna and thereby produce a good match to the antenna over a very wide range of frequencies.

Traditional antenna matching circuits (which use passive elements, capacitors and possibly inductors), are frequency dependent, so that an ideal match only occurs at one frequency (or a small set of frequencies for complex matching networks). The match is typically satisfactory at frequencies near the ideal match frequency, but as the desired frequency gets further and further away from the ideal frequency, the match worsens and antenna performance suffers. In the prior art, this problem of match degradation has been dealt with by tuning the antenna matching circuits as the receiver and/or transmitter changes frequency.

This has worked well in the context of narrow band receivers and transmitters which only needed to have a relatively small bandwidth to accommodate whatever demodulation or modulation techniques they employed.

However, there are applications for wide bandwidth receivers and transmitters that need to be responsive or operate over wide bandwidths.

Non-foster antenna matching circuits for ESAs have been proposed in the prior art by J. G. Linvill and Stephen E. Sussman-Fort, et. al, to improve the signal to noise ratio (SNR) of antenna systems. See, J. G. Linvill, "Transistor Negative Impedance Converters," Proc. IRE, vol. 41, June 1953 and Stephen E. Sussman-Fort and Ronald M. Rudish, "Non-Foster Impedance Matching of Electrically Small Antennas", IEEE Transactions on Antennas and Propagation, Vol. 57, August 2009. They teach a wide band matching method and a corresponding matching circuit, such as a negative impedance inverter (NII) or a negative impedance converter (NIC). See also R. R. Hoskins, "Stability of negative impedance converters," Electronics Letters, vol. 2, no. 9, September 1966. An ESA is generally defined as an antenna whose maximum dimension (of an active element) is no more than wavelengths at the highest frequencies at which the antenna is expected to operate. So, for a dipole with a length of $\lambda/2\pi$, a loop with a diameter of $\lambda/2\pi$, or a patch with a diagonal dimension of $\lambda/2\pi$ would be considered electrically small.

Figure 1:
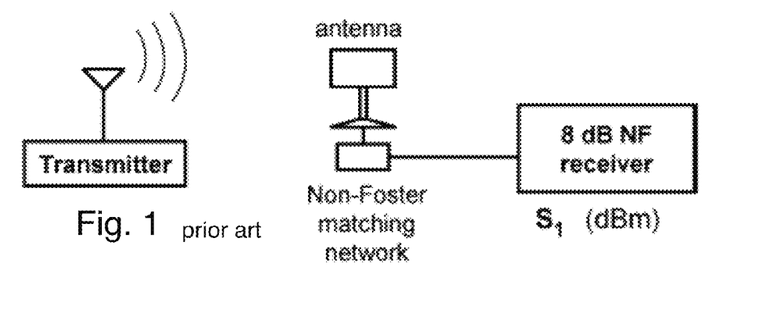
FIG. 1 is a schematic of a non-Foster matching approach for an Electrically Small Antenna to achieve high gain and a reduction of noise figure over a wide band (prior art).

A non-foster network has been proposed to achieve wideband matching between a receiver and an ESA. The non-foster network overcomes the narrow bandwidth and poor gain associated with passive matching circuits that are severely limited by gain-bandwidth theory. FIG. 1 shows a non-foster matching configurations for the electrically small antenna published by Stephen E. Sussman-Fort.

Figure 2:
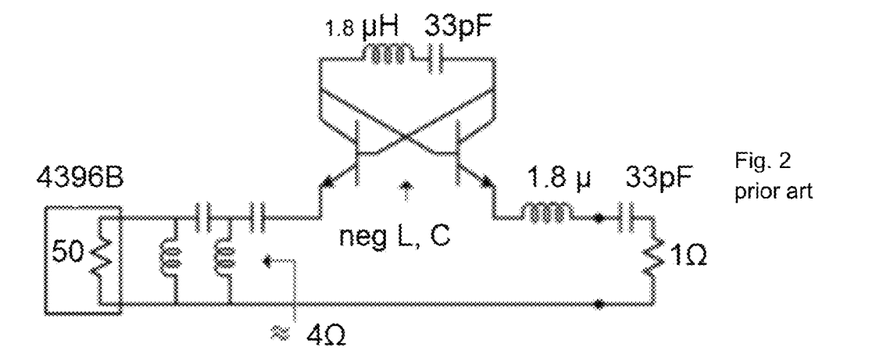
FIG. 2 presents one prior art example of realized series negative capacitor and negative inductor to achieve wide band matching for an Electrically Small Antenna.

The non-foster matching network of FIG. 1 utilizes series/shunt negative capacitor or inductor to implement the wide band matching. FIG. 2 gives one example for realizing the series negative capacitor to achieve such a matching.

Normally, negative capacitance is realized through positive feedback in a NFC and, therefore, oscillates when connected to an improper load impedance. On the other hand, NFCs achieve the best gain performance when on the verge of oscillation. Therefore, tight tolerances are typically required to achieve non-Foster antenna matching circuits.

While there are examples of the use of NFCs in rather precise laboratory settings, no NFCs are found in use in commercial products today because the required circuit parameters typically change as a function of environmental factors (where the antenna is physically located, for example), environmental effects (such as temperature), circuit fabrication tolerances and circuit aging. To date, no solutions to these problems have appeared. There is a need for more robust NFCs that remain stable in a high-performance matching state despite environmental changes and fabrication tolerances, etc.

While a robust NFC is especially important for ESAs, a robust NFC is also quite useful in many other applications, including, for example, in antenna matching circuits which match antennas which are larger than a typical ESA.

BRIEF DESCRIPTION

The present technology provides a method and a circuit to implement non-Foster circuit adaptation and/optimization.

DETAILED DESCRIPTION

Disclosed is a non-foster circuit adaptation and method for stabilizing a non-foster circuit (NFC) and preferably for enabling optimization of non-foster wide band antenna matching using a NFC, preferably for electrically small antennas, and preferably in the presence of environmental variations, circuit construction tolerances and component aging.

The disclosed method and circuit enables optimization and stabilization of NFCs by detecting the NFCs output signals from external signals or internal device noise in an iterative fashion. Typical NFCs employ active feedback to realize the desired negative impedance/reactance conversion or inversion in order to cancel the antenna's positive reactance over a wide bandwidth for wide bandwidth operation. The active feedback of conventional NFCs generates potential positive feedback in the entire system and places the NFCs in a metastable status. This delicate metastability consequently provides desirable gain and sensitivity to weak received signals, but also introduces a vulnerability to the aforementioned environmental variations. A small perturbation due to environmental variations can trigger positive feedback in a prior art NFC, causing it to deviate from its desirable metastable condition and into uncontrolled signal amplification and thus oscillation. There is an observed intermediate status between the metastable condition and oscillation, where oscillation has not yet occurred, but the active device noise from active devices in the NFCs and/or received signals are significantly amplified with a large gain. We call this intermediate status the "noise amplification state". The amplified noises and signals from an NFC may desensitize a receiver located downstream of the NFC. To achieve practical applications of non-Foster antenna matching circuits, the associated NFCs must be able to adapt to environmental changes and dynamically adjust themselves to always remain in the metastable condition rather than noise amplification or oscillation. The disclosed adaptation method and circuits deliver this desirable feature. Important features of this adaptation method and circuit include:

(1) Automatic control: it provides an automatic control loop to always position the NFC to an optimum condition with maximum efficiency and peak gain without stability concerns.

(2) Self-adaptation: it applies the adaptive adjustment capability in varying environments to achieve the best performance.

Figure 7:
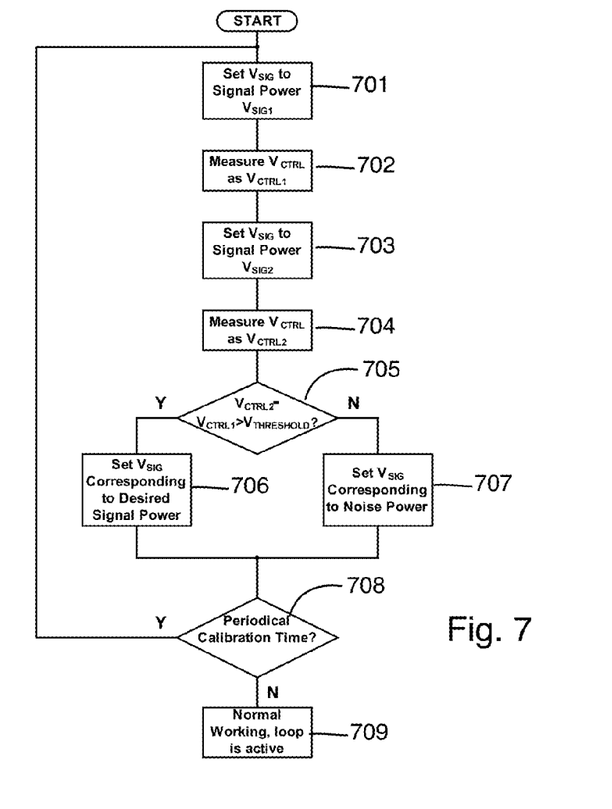
FIG. 7 is a flowchart of the non-foster circuit adaptation method disclosed herein.

(3) Software configurability: the method of FIG. 7 can be implemented in software executing on a computer to assist the optimization of different non-foster circuits.

(4) Compact and low power implementation: the disclosed method permits a compact and low power realization with a very small number of components.

(5) Automatic gain control: the disclosed method also offers desired automatic gain control capability for the receiver front-end.

Figure 3:
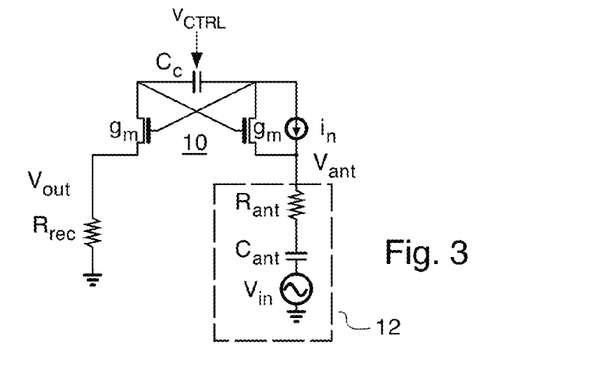
FIG. 3 is one exemplary schematic of a non-foster series negative capacitor used for antenna matching.

A NFC is in an optimized state when it is on the verge of oscillation or instability. And when on the verge of oscillation, it generates large band-limited output noise (i.e. a noise hump) because the internal device noises are amplified greatly near the potential oscillation frequency. Since this noise hump is undesirable, the NFC is detuned slightly from a point on being on the verge of oscillation in order to avoid the noise hump and thus place it in an optimized state. For example, in the non-foster circuit shown in FIG. 3, one device's current noise is amplified at the antenna port with the gain expressed in Eqn. (1) below:

$$V_{ant}/i_n = \frac{C_c(1 + SC_{ant}R_{ant})}{S^2 C_c^2 (R_{ant}C_{ant} + g_m R_{rec} R_{ant} C_{ant}) - g_m(C_{ant} - C_c) + SC_c C_{ant}(g_m R_{rec} - 2)} \quad \text{Eqn. (1)}$$

In FIG. 3, the antenna 12 is modeled as $R_{ant}$ in series with capacitor $C_{ant}$, the received input signal of the antenna is modeled as $V_{in}$, in series with $R_{ant}$ and $C_{ant}$, and one of the devices' channel current noise is modeled as $i_n$. $C_C$ is a capacitor whose value to rendered into a negative capacitance by NFC 10. $C_C$ is preferably implemented as a variable capacitor (a varactor, for example), whose capacitance is controlled by a control signal $V_{CTRL}$.

Figure 3A:
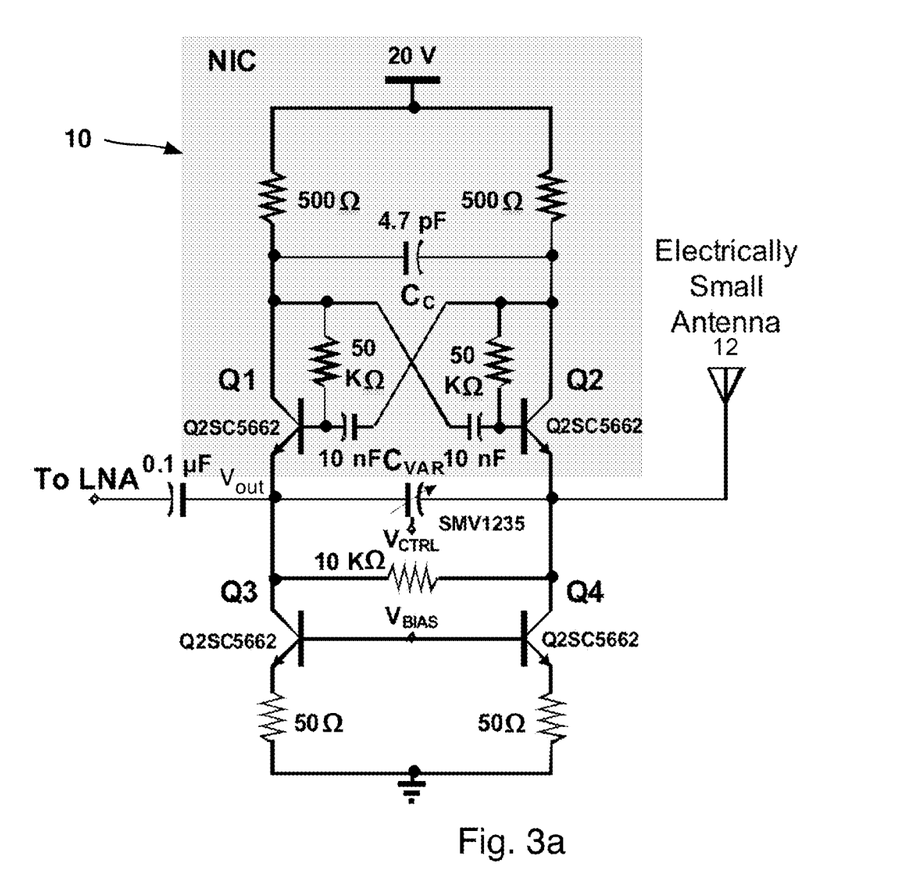
FIG. 3a is one possible embodiment of the exemplary schematic of FIG. 3 wherein active devices are specifically identified thereon and the resistances and capacitances of resistors and capacitors are also specifically identified thereon.

FIG. 3a depicts a detailed schematic of one possible embodiment based on the schematic of FIG. 3. Capacitor $C_C$ is fixed in this embodiment and the variable capacitor is implemented as a varactor $C_{VAR}$ (controlled by $V_{CTRL}$), the varactor $C_{VAR}$ in this embodiment being placed where the negative capacitance derived from $C_C$ is generated. This is done to provide a frequency tuning range for the generated negative capacitance when there is lack of small enough varactors or capacitors ($C_C$ in the circuit of FIG. 3) to realize desirably a small negative capacitance. For example, assume that there is a need to generate a negative capacitance of about −1 pF, which would call for a +1 pF varactor at $C_C$ according to the circuit of FIG. 3. But +1 pF varactors are not readily available, so in the embodiment of FIG. 3a capacitor $C_C$ is a fixed capacitor having a 4.7 pF value which generates a −4.7 pF capacitance at the output of the NFC. A variable capacitor (varactor $C_{VAR}$) is placed in parallel with the output of the NFC so the −4.7 pF capacitance generated by the NFC is offset by the positive value of the capacitance of varactor $C_{VAR}$. The varactor $C_{VAR}$ which was selected produces a 3.6 pF capacitance with a control voltage $V_{CRTL}$ of about 6 volts applied thereto.

Without implying a limitation, preferred device types and the preferred values of capacitors and resistors, etc., are identified on FIG. 3a for the embodiment discussed above. These device types and the values of the capacitors and resistors may be modified as needed by those skilled in the art. The input port of the circuit of FIG. 3a is coupled to an ESA 12 while its output port (where $V_{out}$ is realized) is preferably coupled via a coupling capacitor to a Low Noise Amplifier (LNA) 14 of a receiver or transceiver 11 coupled to the NFC 10. The $V_{BIAS}$ is to control transistors Q3 and Q4 to produce desired bias currents in the core of the NFC 10. In this implementation, the cross-connected transistors Q1, Q2 and capacitor Cc constitute the core of the NFC 10, and all other elements are peripheral thereto to complement the non-foster impedance matching function (the value of $C_C$ is matched by a negative complement at the circuit's output). For example, $C_{VAR}$ is used to extend the tuning range of the NFC 10 while Q3, Q4 and the resistors are employed to provide desired biasing. It should also be apparent that if both a fixed capacitor and a variable capacitor are used to obtain the desired negative capacitance tuning range, the variable capacitor may be placed at $C_C$ and a fixed capacitor (or another variable capacitor) may be used at the output of NFC 10 where the negative capacitance is realized between the input from the antenna 12 and the output where $V_{out}$ is realized.

Because the NFC 10 can generate an identifiable noise hump near its potential oscillation frequency, the NFC 10 is placed into its optimized state by detecting such noise hump power. The optimization sequence can be: (1) measure the noise hump power at either the antenna port (at $V_{ant}$ in FIG. 3.) or the NFC output port (at $V_{out}$ in FIG. 3), (2) compare the measured noise hump power with a desired power that corresponds to the optimized state of the NFC, (3) tune the NFC, such as by changing a capacitor value (such as $C_C$ in FIG. 3 or $C_{VAR}$ in FIG. 3a), to generate the desired level of noise power to achieve the optimized state.

Figure 4:
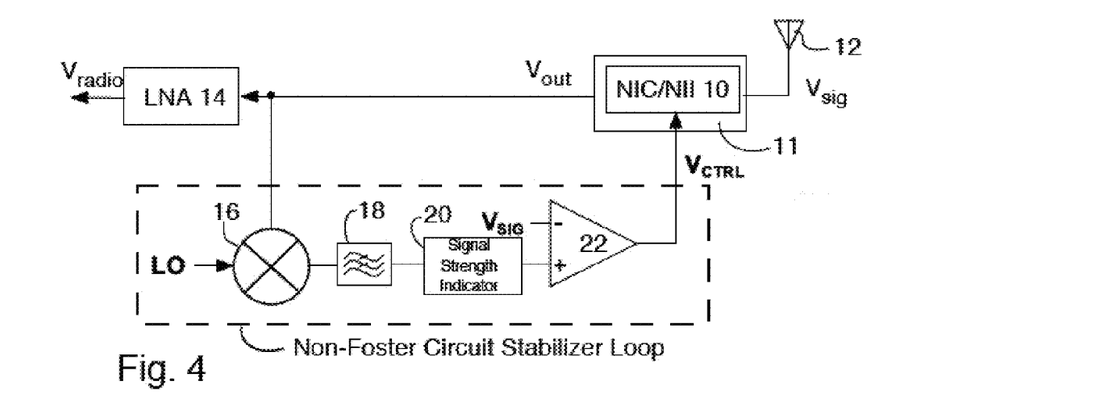
FIG. 4 is a schematic diagram of one embodiment or configuration to accomplish the non-foster circuit optimization through closed loop control and FIG. 4a shows the effect of the filter and the signal strength indicator of a noise hump arriving at the output of 18 in FIG. 4.
Figure 4A:
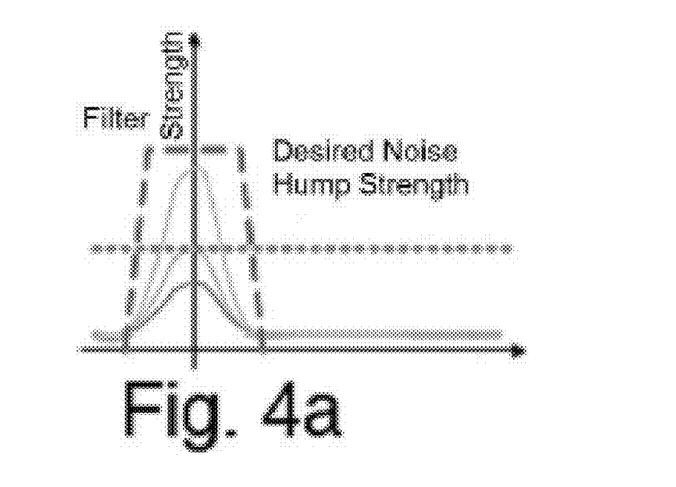

This scheme works well when there is no signal present near the potential oscillation frequency and can be constructed as a close loop control circuit. FIG. 4 shows one possible circuit embodiment where a NFC 10 is utilized in a receiver to as a matching circuit 11 for matching an antenna 12 to a receiver which optionally includes a Low Noise Amplifier (LNA) 14 in its receiver frontend. This embodiment utilizes a mixer 16 to down-convert the output of the NFC 10 into a baseband signal using a Local Oscillator (LO) signal from LO, preferably at the non-Foster circuit's potential oscillation frequency, then a low pass filter 18 is employed to filter out out-of-band signals and extract the signal around the potential oscillation frequency, which is the observation frequency band. The LO can be near (as opposed to "at") the non-Foster circuit's potential oscillation frequency, so long as the frequency difference between the LO and the non-Foster circuit's potential oscillation frequency is within the bandwidth of the feedback loop, as shown in FIG. 4a. In this embodiment a bandwidth of 1 MHz is utilized. Different bandwidths may be used as desired, which should preferably include the frequency range of the non-foster circuit's potential noise hump oscillation and also preferably be sufficiently small to reduce the probability of an incoming signal falling into its bandpass.

A subsequent signal strength indicator 20 detects the signal power and completes the closed loop control to the non-Foster circuit 10 using an Operational Amplifier (Op Amp) 22, for example, to compare the output of the signal strength indicator 20 with a signal $V_{SIG}$ representing the desired noise strength at its inputs and generate the control signal $V_{CTRL}$ at its output.

Figure 5:
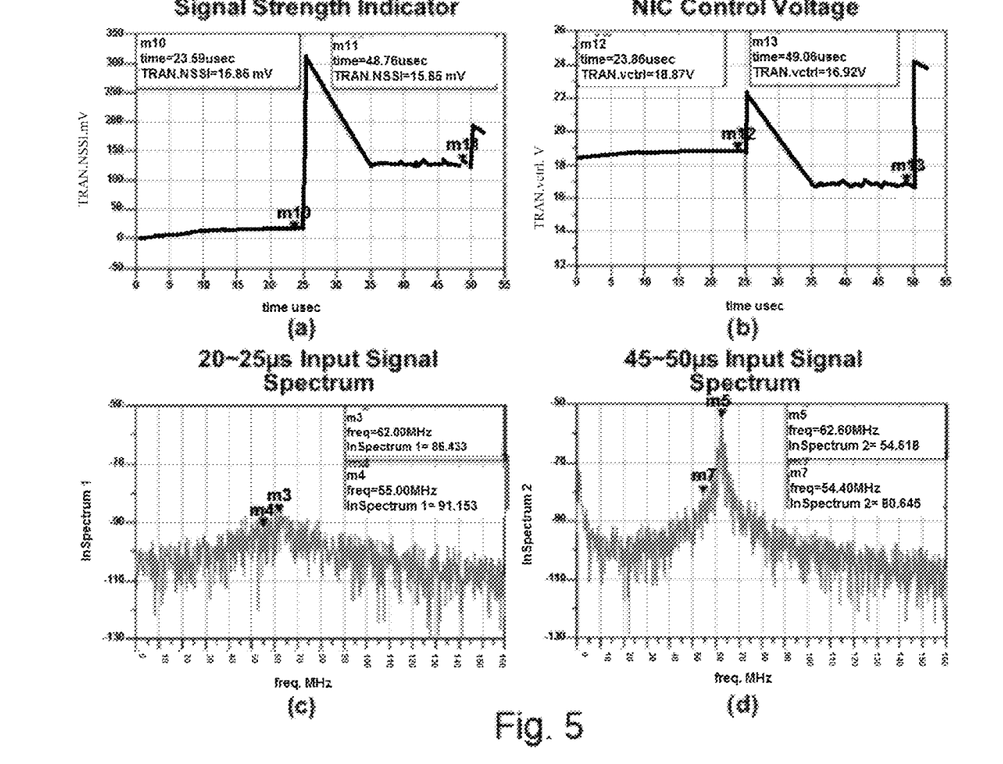
FIG. 5 shows the results of simulations of a non-Foster circuit with closed loop control by graphs (a)-(d).
Figure 6A:
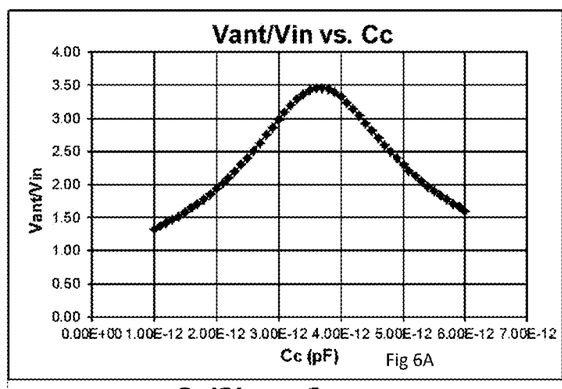
FIG. 6 depicts various non-foster circuit signal gains vs. varactor capacitance that can be programmed by a control voltage $V_{CTRL}$: (a) the sensitivity of the antenna as measured by the ratio of received signal voltage $V_{ant}$ at the NFC to the open circuit antenna voltage when the antenna is in an electric field but not connected to a receiver and where $V_{in}$ is the open circuit antenna voltage; (b) the ratio of received signal voltage $V_{ant}$ at the NFC to the internal input referred noise voltage $V_n$; (c) ratio of (b) to (a); and (d) a family of plots showing that a signal strength change from $V_{SIG1}$ to $V_{SIG2}$, requires a larger control voltage change when there is an input signal in the observation band as compared to the case without an input signal.
Figure 6B:
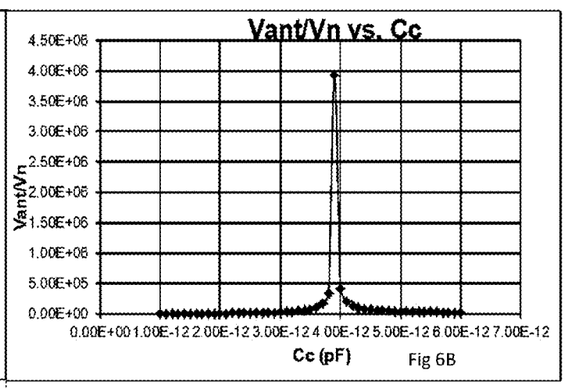
Figure 6C:
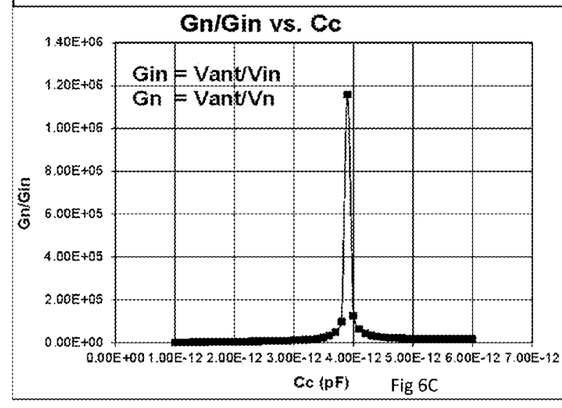
Figure 6D:
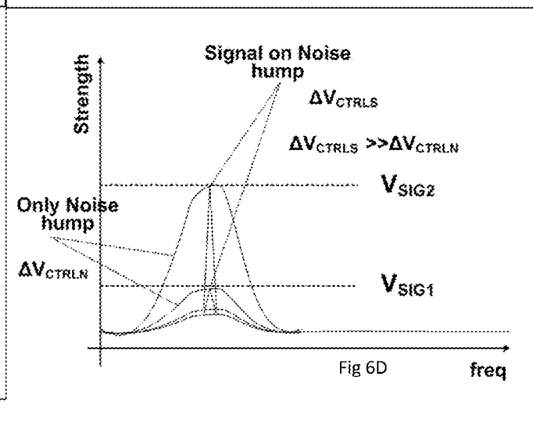

FIG. 5 shows simulation results of exemplary control the non-Foster circuit through the closed loop of FIG. 4. It demonstrates that the input signal strength follows the $V_{SIG}$ control from 10 mV to 150 mV through closed loop control. The input signal spectrum also validates this. The NFC 10 of FIG. 4 may be either a negative impedance inverter (NII) or a negative impedance converter (NIC). FIG. 3 shows an embodiment of NFC 10 as a NII for generating a negative capacitance, based on the value of $C_C$, which negative capacitance is arranged in this embodiment in series with the impedances of (i) the antenna 12 as represented by $R_{ant}$ and $C_{ant}$ and (ii) the receiver as represented by $R_{rec}$. A NIC may be used instead to generate a negative inductance which is useful in certain impedance matching circuits 11. The matching circuit 11 may include additional capacitors and/or inductors arranged in various tank circuit configurations known per se in the art, but with one or more negative capacitors and/or one or more negative inductors therein to provide a wider bandwidth than is possible using only positive capacitors and/or inductors. The matching circuit 11 may be implemented as just a NIC or NII, or it may be implemented with additional reactive elements in addition to one of more NICs or NIIs.

FIG. 5 depicts the simulation results of the non-Foster circuit of FIG. 4 where in graph (a) $V_{SIG}$ equals 10 mV from 0 to 25 µsec, then switches to 150 mV from 25 to 50 µsec, then changes back to 10 mV; the signal strength indicator follows $V_{SIG}$ by closed loop control; in graph (b) the non-Foster circuit control signal changes accordingly; in graph (c) the input signal spectrum from 20 to 25 µsec shows a −86 dBv noise hump corresponding to 10 mV signal strength; and in graph (d) the signal spectrum from 45 to 50 µsec shows −54.5 dBv noise hump corresponding to 131 mV signal strength.

The control circuit shown in FIG. 4 can control the NFC 10 to place it in its optimized state with a pre-defined noise level assuming that there is no external signal in the observed frequency band. However, there are times when external input signals fall into the observed frequency band. If the input signal is stronger than the noise in the observed frequency band, the aforementioned control circuit of FIG. 4 may not optimize the non-Foster circuit 10 well using $V_{SIG}$ as described above. In view of this issue, there are two situations for which the non-Foster circuit 10 should preferably be optimized separately:

(1) if there is no external signal in the observed frequency band, the control circuit shown in FIG. 4 can optimize the NFC 10 with $V_{SIG}$, as a DC value, representing the optimum noise level to achieve best efficiency and peak gain from the non-Foster circuit (this is, on the verge of oscillation) as previously described.

(2) if there is external signal in the observed frequency band, the control circuit shown in FIG. 4 can serve as Automatic Gain Control (AGC) circuit to amplify the signal to a desired strength level by setting $V_{SIG}$, whose value is then determined by the downstream receiver which includes LNA 14 so as to not de-sensitize the circuits following the LNA 14 in the receiver as well as ensure a desirable noise performance. The difference of this case from situation (1) above is the detected signal energy within the observed frequency band consists of not only the noise generated by the NFC 10, but also the incoming signals within the observed frequency band arriving via antenna 12. A wireless communication receiver typically includes a LNA 14, mixer, an intermediate frequency filter and a programmable gain amplifier (only the LNA 14 is depicted for ease of illustration since wireless communication receivers are well known in the art). The front end of the wireless communication receiver includes the aforementioned LNA 14 and the receiver normally prefers a constant output signal strength from the receiver's front end circuit, for example, the output of the aforementioned LNA 14. In the embodiment of FIG. 4, a signal is received by the antenna 12, then goes via the NFC 10 to the LNA 14 and then to remaining portions of the wireless communication system via the output of the LNA 14. The signal strength should not be too big to de-sensitize the subsequent circuits of the receiver such as the aforementioned mixer, and should not be too small to degrade the receiver sensitivity due to the noise contribution from the subsequent circuits. To best adapt the NFC 10, a different NFC control voltage $V_{SIG}$ than that used in situation (1) may be needed to ensure the NFC 10 in combination with LNA 14 delivers a constant output signal at $V_{radio}$ to the remaining portions of the receiver. The desired output signal level from the NFC 10 and LNA 14 is determined by the receiver's amplifier and mixer circuits' noise and linearity performance. The corresponding $V_{SIG}$ is to control the NFC 10 to provide this desired output signal strength (after amplification by LNA 14), and can be derived by simulation or by actual measurement.

To determine the $V_{SIG}$ to the control loop, we first assume the NFC 10 is operating in situation (1), where the $V_{SIG}$ is set to optimize NFC's impedance matching performance with constraints on the generated noise power. The receiver system analyzes the received signals under this condition and determines whether there are signals within the observed frequency band or not. If there is no signal inside the band, the $V_{SIG}$ preferably remains as is. If there are detected signals and their strength is significantly higher than the noise power generated by the NFC 10 within the observed frequency band, for example >6 dB, then $V_{SIG}$ can be configured to a different value to enable the NFC 10 and LNA 14 to provide a desired output signal strength as desired by the rest of the receiver system. Since the majority power within the observed frequency band is contributed by the input signals in this case, so is the output signal from the NFC 10. In addition, the NFC 10 is controlled in situation (2) above is to set the NFC's gain to provide a constant output signal from the LNA 14 (for example), and thus the voltage $V_{SIG}$ essentially performs automatic gain control (AGC) function. It is worth to note there is much stronger signal (>6 dB in the example given) than the generated noise by NFC 10 within the observed frequency band in situation (2) above. When the signal is small and below the receiver sensitivity level, the NFC 10 is then controlled as desired with reference to situation (1) above.

To differentiate between the two situations noted above, that is, with and without a signal in the observed frequency band, a two-point measurement method is preferably utilized. It is based on the fact that the Non-Foster Circuit Stabilizer Loop of FIG. 4 generates different values of $V_{CTRL}$ in response to an input signal at antenna 12 than to internal device noise of the NFC 10. Eqn. (2) gives the input signal amplification factor and Eqn. (3) shows the internal device noise amplification factor for the NIC 10 shown in FIG. 3. FIG. 6 demonstrates by graph (a) the gain of the received signal voltage $V_{ant}$ from the antenna 12 over the open circuit voltage $V_{in}$ of the antenna 12 versus the value of the negative capacitance $C_C$, demonstrates by graph (b) the gain of the received signal voltage $V_{ant}$ from the NFC 10 over the device input referred noise voltage ($V_n = i_n / g_m$), and demonstrates by graph (c) the ratio between them. It is apparent that the output signal voltage gain variation is much smaller than the device input referred noise voltage gain near the potential oscillation frequency. It implies that a control voltage ($V_{CRTL}$) change of the NFC 10 will introduce a much larger noise strength change than the signal strength change. Therefore, we utilize the two point measurement method to determine if there is a signal in the observed band based upon this.

FIG. 7 is a flowchart of one embodiment of the disclosed non-Foster circuit adaptation method. In the method of FIG. 7, first set $V_{SIG}$ to $V_{SIG1}$ at step 701 and measure the non-Foster control voltage as $V_{CTRL1}$ at step 702, then change $V_{SIG}$ to $V_{SIG2}$ (see step 703) and measure the corresponding non-Foster control voltage as $V_{CTRL2}$ (see step 705), where $V_{SIG2} > V_{SIG1}$. If $V_{CTRL1} - V_{CTRL2}$ is larger than a pre-defined threshold ($V_{THRESHOLD}$), there is no signal inside the observed band and branch N is taken from step 705; otherwise, there is signal inside the observed band and branch Y is taken from step 705.

$$V_{ant}/V_{in} = \frac{SC_{ant}C_c(R_{rec} + 2/g_m) - C_{ant}}{(R_{rec} + R_{ant} + 2/g_m)SC_{ant}C_c + C_c - C_{ant}} \quad \text{Eqn. (2)}$$

$$V_{ant}/V_n = \frac{C_c(1 + SC_{ant}R_{ant})g_m}{S^2C_c^2(R_{ant}C_{ant} + g_mR_{rec}R_{ant}C_{ant}) - g_m(C_{ant} - C_c) + SC_cC_{ant}(g_mR_{rec} - 2)} \quad \text{Eqn. (3)}$$

FIG. 6 depicts various non-Foster circuit signal gains vs. varactor capacitance which can be programmed by the control voltage $V_{CTRL}$: graph (a) shows the ratio of received signal voltage $V_{ant}$ at the NFC to $V_{in}$ from the antenna; graph (b) shows the ratio of received signal voltage $V_{ant}$ at the NFC to the internal device input referred noise voltage $V_n$, ($V_n = i_n / g_m$) graph (c) shows the ratio of graphs (b) to (a), and graph (d) shows a family of plots showing that a signal strength change from $V_{SIG1}$ to $V_{SIG2}$ requires a larger control voltage change when there is an input signal in the observed band as compared to the case without an input signal.

Based on this two-point measurement technique, and considering the embodiment of the method set forth in FIG. 7 again, we can determine whether or not there is an input signal inside the observed band by the results of step 705. If no input signal is recognized, the method (see step 707) configures the NFC 10 of FIG. 4 to its optimized state with a pre-defined $V_{SIG}$ representing the desired noise hump level; if there is an external signal (see step 707), the circuit shown in FIG. 4, serves as automatic gain control to control the NFC for best signal reception quality.

Before considering the remaining blocks of FIG. 7, let us consider how the various values discussed above with reference to FIG. 7 might be determined. Those values are preferably determined by a computer simulation of the circuit of FIG. 4 or by FIG. 4 circuit hardware measurement. As mentioned above with reference to FIG. 6, a two-point measurement is preferably used to differentiate the situation with or without a signal in the observation frequency band. It is expected that $V_{CTRL2} - V_{CTRL1}$ is larger when there is a signal in the observation band than the situation when there is no such signal. Determining the threshold of $V_{CTRL2} - V_{CTRL1}$ to differentiate these two situations may be determined experimentally or analytically. Currently, $V_{SIG}$ is set to a very small value to define $V_{CTRL1}$. Then $V_{SIG}$ is set to a larger value to define $V_{CTRL2}$. When there is no received signal, these two values can be determined through circuit simulation or hardware measurement. Then we assume there is a received signal in the observed band which is at least 6 dB higher than the noise induced in the background and/or by the NFC 10, but if not, then we treat it as if there were no signal present. In other words, if there is a received signal present which is 6 dB higher than noise floor, this scenario is defined as "with signal". If there is no received signal, or is the received signal is less than 6 dB higher than the noise floor, this scenario is defined as "no signal". $V_{CTRL1}$ and $V_{CTRL2}$ are determined again for the "with signal" scenario through simulation or hardware measurement. We then take an average of $V_{CTRL2} - V_{CTRL1}$ for the aforementioned two cases as the value of the threshold $V_{THRESHOLD}$. The 6 dB value used here as an exemplary value to provide a good enough Signal to Noise Ratio (SNR) for the receiver to identify the signal from a noisy background. Values other than the 6 db mentioned above may used if desired depending of the capabilities of the receiver being used and any signal processing be utilized.

Once the signal conditions (with a signal with and with no signal in the observed frequency band) are determined, we can set the corresponding $V_{SIG}$ We rely on simulation or hardware characterization to determine the best $V_{SIG}$ corresponding to a noise power which can provide best performance, including gain, sensitivity etc. When there is signal inside the band, the $V_{SIG}$ is normally determined by the circuits of the receiver downstream of LNA 14 that requests a fixed signal power that can provide best linearity and noise.

The value of $V_{SIG}$ can be determined according to system performance requirement. When there is no signal within the detection frequency band, $V_{SIG}$ essentially determines the measured noise hump power and the gain of the non-foster circuit. For applications in receiver, the non-foster circuit input referred noise must be smaller than the value of the target minimum receiving power (receiver sensitivity) subtracting the system required signal-to-noise ratio (SNR). Therefore, the target noise hump power equals to the allowable input referred noise power multiplied by the non-foster circuit gain, which can be calculated or simulated given a detail design. For applications in transmitter, the noise hump power must be less than the maximum out-of-band noise level specified by each standard in order to comply with FCC regulations. When there is signal within the detection frequency band, $V_{SIG}$ determines the output signal strength of the non-foster circuit. This scenario normally happens during receiving mode since the transmitter can be controlled to not send any signal during non-foster circuit optimization period. The output signal from the non-foster circuit is sent to the following circuits, such as LNA or mixer. These circuits normally favor a specific signal strength to achieve the best signal quality by minimizing the effects of noise and distortions. Therefore, the value of $V_{SIG}$ can be determined according to the desired output signal strength of the subsequent circuits through analysis of their noise and linearity performances. It is worth to note that the value of $V_{SIG}$ determined by the aforementioned methods may not place the non-foster circuit in the optimized condition for all systems. Hence, circuit simulation or hardware measurement may be necessary to refine the value in some circumstances.

The following example according to the principles of the present invention is presented to gain a fully understanding of the concepts presented and it is by no means the only example or embodiment to which the concepts presented may be applied. Assume that the wireless receiver prefers a −30 dBm output power at the front end LNA 14. This preference has nothing to do with disclosed NFC 10. However, there is a corresponding $V_{SIG1}$ for the LNA 14 to deliver a −30 dBm output signal for a given design loop. If the LNA has 20 dB gain, that is to say the output of the NFC 10 should be at −50 dBm. We can use simulation or direct measurement to determines this $V_{SIG1}$ to provide this −50 dBm output from NFC 10 and thus −30 dBm output from LNA (with its assumed 20 dB gain).

With regards to the preferred −30 dBm output from the LNA 14 mentioned above, this value is determined by the design of wireless receiver and this value will likely vary from receiver to receiver as a function of its design.

Concurrently, assume that the receiver cannot emit more than −54 dBm output to avoid unnecessary interference with other receivers. This value is set by governmental regulations (issued, for example, by the FCC in the United States). So, how much noise power the NFC 10 can output can be calculated. It should be noted there is a relationship between the NFC's output power and its emissions back into the antenna 12. It is the emissions back to the antenna which are the subject of governmental regulation, but complying with the governmental regulation affects the allowable output of the NFC 10 due to this relationship which can be simulated or calculated. Assuming there is no difference between these two values (assuming that the relationship is one-to-one), then the output maximum signal strength from the NFC 10 is also limited to −54 dBm, and hence the maximum signal strength from the LNA is −34 dBm. Again, we can use simulation or direct measurement to determine $V_{SIG2}$ to deliver −34 dBm output from the LNA.

Again, we can use simulation or direct measurement to determine $V_{SIG2}$ to deliver −34 dMb output from the LNA.

When there is no signal within desired BW (situation (1) above), $V_{SIG2}$ is used to ensure the emission from the NFC 10 satisfies the requirement described in the following paragraph. When there is signal identified (6 dB>noise, situation 2), $V_{SIG1}$ is used to guarantee the LNA output signal strength is always approximately −30 dBm (for this particular embodiment) that ensures the receiver performance and satisfies the emission limitation.

The relation between LNA output signal strength and $V_{SIG}$ can be determined by analysis, simulation or measurement. The disclosed loop has a gain from the $V_{SIG}$ to the output signal strength from LNA, which is determined by NIC gain $G_{NIC}$, mixer gain $G_{MIXER}$, filter gain $G_{filter}$, signal strength indication gain $G_{SSI}$ and comparator gain $G_{COMP}$. It can be expressed by a simple equation:

$$(V_{in} - V_{SIG}) * G_{COMP} * G_{NIC} * G_{MIX} * G_{filter} * G_{SSI} = V_{SIG},$$
where $V_{in} = V_{NIC} * G_{MIX} * G_{filter} * G_{SSI}$.

Where $V_{NIC}$ is the output signal from NIC, that can be linked to the LNA output by the equation:

$$V_{LNA} = V_{NIC} * G_{LNA}, \text{ where } G_{LNA} \text{ is the gain of LNA}.$$

Through these equations, $V_{SIG}$ can be computer from desired $V_{LNA}$. With regards to $V_{LNA}$, it is determined by receiver itself and by governmental regulation, as noted above.

Returning to FIG. 7, after setting $V_{SIG}$ as appropriate by blocks 706 or 707, then a test is made at block 708 to determine whether the value of $V_{SIG}$ should be recalculated as the end of a calibration time. If the end of a calibration time has occurred then the Y branch is taken and VSIG is determined again. If the end of a calibration time has not yet occurred then the N branch is taken to block 709 and the feedback loop of FIG. 4 functions with the previously determined value for $V_{SIG}$. The value selected for the calibration time depends on the speed of variation of the environment in which circuit of FIG. 4 is used. If environmental change is very fast, the $V_{SIG}$ needs frequent re-calibration. For example, if the antenna 12 is mounted on a moving vehicle, then calibration time might be as short as several milliseconds On the other hand, in a relatively static environment, a longer calibration time, such as a couple of seconds might be used. So the value selected for the calibration time is preferably controlled by the speed at which the antenna is relocated in its signal environment.

The functions of FIG. 7 may be realized in a number of ways known to persons skilled in the art. For example, means for realizing the functions in FIG. 7 might be a digital signal processor, a field programmable gate array or a general purpose digital computer. The general purpose digital computer may comprise a non volatile memory and a processor executing the instructions stored in the non volatile memory.

The challenge is to set $C_C$. $C_C$ can be calculated as giving the max value in equation 3, that is the value of $C_C$ that makes the denominator minimum while still being realizable. The roots that result in the denominator zero give a value of $C_C$ that is complex. Then $C_C$ is reduced by about 10-15% and then the real portion thereof is utilized. This provides a desirable high gain of the NFC.

Figure 8:
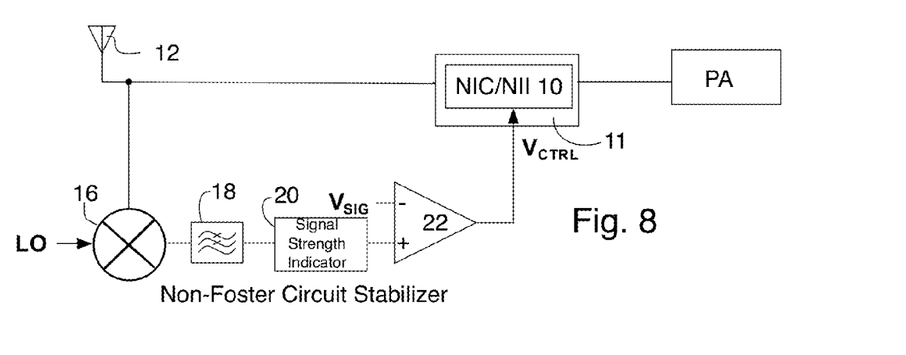
FIG. 8 is a non-foster circuit applied to a transmitting embodiment.

The embodiment of FIG. 4 is obviously a receiver. FIG. 8 shows the application of NFC 10 to a transmitting embodiment. When applied in a transmitter, the NFC 10 can be optimized by detecting the generated noise power, wherein, the output noise power must be smaller than the specified maximum out-of-band power level specified by the intended applications. A similar tuning approach, as described above for the receiver of FIG. 4, can be utilized to determine the desired $V_{SIG}$. The control loop of FIG. 8 subsequently determines $V_{CTRL}$ and places the non-foster circuit in the optimized state.

Having described the invention in connection with certain embodiments thereof, modification will now suggest itself to those skilled in the art. As such, the invention is not to be limited to the disclosed embodiments except as is specifically required by the appended claims.

All elements, parts and steps described herein are preferably included. It is to be understood that any of these elements, parts and steps may be replaced by other elements, parts and steps or deleted altogether as will be obvious to those skilled in the art.

Broadly, this writing discloses a method of and circuit for improving stabilization of a non-Foster circuit. The method comprises steps of and the circuit includes means for measuring a noise hump power at an antenna port or an output port of the non-Foster circuit, comparing the measured noise hump power with a desired level of noise power that corresponds to a desired operating state of the non-Foster circuit, and tuning the non-Foster circuit to generate the desired level of noise power to achieve the desired operating state of the non-Foster circuit.

CONCEPTS

At least the following concepts are presented in this writing.

Concept 1. A method of improving stabilization of a non-Foster circuit comprising:
  measuring a noise hump power at an antenna port or an output port of the non-Foster circuit,
  comparing the measured noise hump power with a desired level of noise power that corresponds to a desired operating state of the non-Foster circuit, and
  tuning the non-Foster circuit to generate the desired level of noise power to achieve the desired operating state of the non-Foster circuit.

Concept 2. The method of Concept 1 further including differentiating between two situations where there is a significant in band signal and where there is no significant in band signal present to determine the desired noise power.

Concept 3. The method of Concept 2 wherein the step of differentiating between the two situations includes performing a two-point measurement to differentiate situations with and without a signal in an observed frequency band.

Concept 4. The method of Concept 2 wherein a significant in band signal is a signal which is at least 3 dB greater than noise generated by said non-Foster circuit.

Concept 5. The method of Concept 2 wherein a significant in band signal is a signal which is at least 6 dB greater than a noise floor of said non-Foster circuit.

Concept 6. A matching circuit for coupling an antenna and a receiver, the matching circuit comprising:
  a non-Foster circuit coupling the antenna to the receiver;
  a mixer having a first input coupled to an output of the non-Foster circuit and having a second input coupled to a local oscillator;
  a signal strength detector for measuring the signal strength of a signal outputted by the mixer;
  a comparer circuit for comparing an output of the signal strength detector with a signal corresponding to a desired noise level, the comparer circuit generating a control signal for controlling the reactance of a reactive element disposed within said non-Foster circuit.

Concept 7. The matching circuit of Concept 6 wherein the non-Foster circuit is implemented as a Negative Impedance Inverter and the reactive element is a variable capacitor, the control signal for controlling the capacitance of said variable capacitor.

Concept 8. A matching circuit for coupling an antenna and a transmitter, the matching circuit comprising:
  an adjustable non-Foster circuit coupling the antenna to the transmitter;
  a mixer having a first input coupled to an output of the non-Foster circuit and having a second input coupled to a local oscillator;
  a signal strength detector for measuring the signal strength of a signal outputted by the mixer;
  a comparer circuit for comparing an output of the signal strength detector with a signal corresponding to a desired noise level of the non-Foster circuit, the comparer circuit generating an adjustment signal to the non-Foster circuit.

Concept 9. A matching circuit for coupling an antenna and a transmitter, the matching circuit comprising:
  a non-Foster circuit coupling the antenna to the transmitter;
  a mixer having a first input coupled to an output of the non-Foster circuit and having a second input coupled to a local oscillator;
  a signal strength detector for measuring the signal strength of a signal outputted by the mixer;
  a comparer circuit for comparing an output of the signal strength detector with a signal corresponding to a desired noise level, the comparer circuit generating a control signal for controlling the reactance of a reactive element disposed within said non-Foster circuit.

Concept 10. A stabilization circuit for improving stabilization of a non-Foster circuit, the stabilization circuit comprising:
  means for measuring a noise hump power at an antenna port or an output port of the non-Foster circuit,
  means for comparing the measured noise hump power with a desired level of noise power that corresponds to a desired operating state of the non-Foster circuit, and
  means for tuning the non-Foster circuit to generate the desired level of noise power to achieve the desired operating state of the non-Foster circuit.

Concept 11. The stabilization circuit of Concept 10 further including means for differentiating between two situations where there is a significant in band signal and where there is no significant in band signal present to determine the desired noise power.

Concept 12. The stabilization circuit of Concept 11 wherein the means for differentiating between the two situations includes means for performing a two-point measurement to differentiate situations with and without a signal in an observed frequency band.

Concept 13. The stabilization circuit of Concept 11 wherein a significant in band signal is a signal which is at least 3 dB greater than noise generated by said non-Foster circuit.

Concept 14. The stabilization circuit of Concept 11 wherein a significant in band signal is a signal which is at least 6 dB greater than a noise floor of said non-Foster circuit.

What is claimed is:

1. A stabilization circuit for improving stabilization of a non-Foster circuit, the stabilization circuit comprising:
  means for measuring a noise hump power at an antenna port or an output port of the non-Foster circuit, means for comparing the measured noise hump power with a desired level of noise power that corresponds to a desired operating state of the non-Foster circuit, and means for tuning the non-Foster circuit to generate the desired level of noise power to achieve the desired operating state of the non-Foster circuit.

2. The stabilization circuit of claim 1 further including means for differentiating between two situations where there is a significant in band signal and where there is no significant in band signal present to determine the desired noise power.

3. The stabilization circuit of claim 2 wherein the means for differentiating between the two situations includes means for performing a two-point measurement to differentiate situations with and without a signal in an observed frequency band.

4. The stabilization circuit of claim 2 wherein a significant in band signal is a signal which is at least 3 dB greater than noise generated by said non-Foster circuit.

5. The stabilization circuit of claim 2 wherein a significant in band signal is a signal which is at least 6 dB greater than a noise floor of said non-Foster circuit.

6. A matching circuit for coupling an antenna and a receiver, the matching circuit comprising:
a non-Foster circuit coupling the antenna to the receiver;
a mixer having a first input coupled to an output of the non-Foster circuit and having a second input coupled to a local oscillator;
a signal strength detector for measuring the signal strength of a signal outputted by the mixer;
a comparer circuit for comparing an output of the signal strength detector with a signal corresponding to a desired noise level, the comparer circuit generating a control signal for controlling the reactance of a reactive element disposed within said non-Foster circuit.

7. The matching circuit of claim 6 wherein the non-Foster circuit is implemented as a Negative Impedance Inverter and the reactive element is a variable capacitor, the control signal for controlling the capacitance of said variable capacitor.

8. A matching circuit for coupling an antenna and a transmitter, the matching circuit comprising:
an adjustable non-Foster circuit coupling the antenna to the transmitter;
a mixer having a first input coupled to an output of the non-Foster circuit and having a second input coupled to a local oscillator;
a signal strength detector for measuring the signal strength of a signal outputted by the mixer;
a comparer circuit for comparing an output of the signal strength detector with a signal corresponding to a desired noise level of the non-Foster circuit, the comparer circuit generating an adjustment signal to the non-Foster circuit.

9. A matching circuit for coupling an antenna and a transmitter, the matching circuit comprising:
a non-Foster circuit coupling the antenna to the transmitter;
a mixer having a first input coupled to an output of the non-Foster circuit and having a second input coupled to a local oscillator;
a signal strength detector for measuring the signal strength of a signal outputted by the mixer;
a comparer circuit for comparing an output of the signal strength detector with a signal corresponding to a desired noise level, the comparer circuit generating a control signal for controlling the reactance of a reactive element disposed within said non-Foster circuit.

10. A method of improving stabilization of a non-Foster circuit comprising:
measuring a noise hump power at an antenna port or an output port of the non-Foster circuit,
comparing the measured noise hump power with a desired level of noise power that corresponds to a desired operating state of the non-Foster circuit, and
tuning the non-Foster circuit to generate the desired level of noise power to achieve the desired operating state of the non-Foster circuit.

11. The method of claim 10 further including differentiating between two situations where there is a significant in band signal and where there is no significant in band signal present to determine the desired noise power.

12. The method of claim 11 wherein the step of differentiating between the two situations includes performing a two-point measurement to differentiate situations with and without a signal in an observed frequency band.

13. The method of claim 11 wherein a significant in band signal is a signal which is at least 3 dB greater than noise generated by said non-Foster circuit.

14. The method of claim 11 wherein a significant in band signal is a signal which is at least 6 dB greater than a noise floor of said non-Foster circuit.

15. The method of claim 11 wherein the step of differentiating between the two situations includes performing a two-step measurement to differentiate situations with and without a signal in an observed frequency band.

* * * * *